(12) United States Patent
Nakayama et al.

(10) Patent No.: US 7,538,649 B2
(45) Date of Patent: May 26, 2009

(54) SUPERCONDUCTING ELECTROMAGNET

(75) Inventors: Takeshi Nakayama, Ibaraki (JP); Shogo Maeno, Ibaraki (JP)

(73) Assignee: Hitachi, Ltd., Tokyo (JP)

( * ) Notice: Subject to any disclaimer, the term of this patent is extended or adjusted under 35 U.S.C. 154(b) by 60 days.

(21) Appl. No.: 11/623,614

(22) Filed: Jan. 16, 2007

(65) Prior Publication Data

US 2007/0216506 A1    Sep. 20, 2007

(30) Foreign Application Priority Data

Jan. 17, 2006   (JP)   ............... 2006-008665

(51) Int. Cl.
   *H01F 1/00*   (2006.01)
   *H01F 6/00*   (2006.01)
(52) U.S. Cl. .................................................. 335/216
(58) Field of Classification Search ................. 335/216, 335/296
   See application file for complete search history.

(56) References Cited

U.S. PATENT DOCUMENTS

| | | | | |
|---|---|---|---|---|
| 4,024,727 A | * | 5/1977 | Berry et al. ....................... 62/6 |
| 4,535,595 A | * | 8/1985 | Keller et al. ................... 62/3.1 |
| 4,717,405 A | * | 1/1988 | Budliger ............................ 62/6 |
| 4,959,964 A | * | 10/1990 | Saho et al. .................... 62/51.1 |
| 5,001,448 A | * | 3/1991 | Srivastava et al. ........... 335/301 |
| 5,181,385 A | * | 1/1993 | Saho et al. .................... 62/51.1 |
| 5,296,812 A | * | 3/1994 | Kitamura et al. ............. 324/319 |
| 5,373,275 A | * | 12/1994 | Itoh et al. .................... 335/216 |
| 5,435,136 A | * | 7/1995 | Ishizaki et al. ................ 60/517 |
| 5,465,579 A | * | 11/1995 | Terada et al. ...................... 62/6 |
| 5,469,123 A | * | 11/1995 | Muller ........................ 335/301 |
| 5,632,149 A | * | 5/1997 | Tanigawa et al. ................. 62/6 |
| 5,701,742 A | * | 12/1997 | Eckels et al. ...................... 62/6 |
| 5,701,744 A | * | 12/1997 | Eckels et al. ................. 62/47.1 |
| 5,936,499 A | * | 8/1999 | Eckels ........................ 335/216 |
| 5,960,868 A | * | 10/1999 | Kuriyama et al. ........... 165/135 |
| 6,029,458 A | * | 2/2000 | Eckels ........................ 62/47.1 |

(Continued)

FOREIGN PATENT DOCUMENTS

DE    4415847    8/1995

(Continued)

OTHER PUBLICATIONS

Introduction of Cryogenic Engineering by Hiroyasu Ogiwara, et al, Tokyo Denki University 1999.

(Continued)

*Primary Examiner*—Elvin G Enad
*Assistant Examiner*—Alexander Talpalatskiy
(74) *Attorney, Agent, or Firm*—Mattingly & Malur, PC (57) ABSTRACT

A superconducting electromagnet is provided with a magnetic shield for protecting, from a leakage magnetic flux of the superconducting electromagnet, a motor for driving a cryocooler for cooling a cooling medium in a coil vessel, in which the superconducting coil is housed with the cooling medium. The magnetic shield includes a pair of ferromagnetic material plates placed opposite each other across the motor. Leakage magnetic fluxes in an opening space formed between a pair of the ferromagnetic material plates are attracted thereto to drastically reduce a density of the leakage magnetic fluxes around the motor. The opening space formed between the ferromagnetic material plates also facilitates maintenance of the cryocooler and the motor.

14 Claims, 11 Drawing Sheets

U.S. PATENT DOCUMENTS

| | | | |
|---|---|---|---|
| RE36,782 E * | 7/2000 | Brown et al. | 335/216 |
| 6,201,462 B1 * | 3/2001 | Laskaris et al. | 335/299 |
| 6,246,308 B1 * | 6/2001 | Laskaris et al. | 335/216 |
| 6,570,475 B1 * | 5/2003 | Lvovsky et al. | 335/216 |
| 2005/0110491 A1 * | 5/2005 | Havens | 324/318 |

FOREIGN PATENT DOCUMENTS

| | | |
|---|---|---|
| EP | 0116364 | 8/1984 |
| EP | 0359262 | 3/1990 |
| EP | 359262 A2 * | 3/1990 |
| JP | 06-188466 | 7/1994 |
| JP | 06188466 A * | 7/1994 |
| JP | 2004-349477 | 12/2004 |
| JP | 2004349477 A * | 12/2004 |

OTHER PUBLICATIONS

Bozorth, R.M., "Ferromagnetism", D.Van Nostrand Co., Inc., 1951, pp. 844-849.

* cited by examiner

SUPERCONDUCTING ELECTROMAGNET

CROSS REFERENCE TO RELATED APPLICATIONS

This application claims the benefit of Japanese Patent Application No. 2006-008665 filed on Jan. 17, 2006, the disclosure of which is incorporated herein by reference.

BACKGROUND OF THE INVENTION

1. Field of the Invention

The present invention relates to a superconducting electromagnet, and more specifically, to a magnetic shield structure of a motor for driving a cryocooler provided for the superconducting electromagnet.

2. Description of the Related Art

A superconducting electromagnet is used, for example, in a magnetic resonance imaging (MRI) machine. The MRI machine measures a nuclear magnetic resonance (hereinafter referred to as an NMR) signal detected from an electromagnetic wave which is obtained according to a spin state of a hydrogen nucleus with the NMR phenomenon; processes the signal; and creates, from the processed signal, an image of a hydrogen nucleus density distribution in a human subject's body. When the MRI machine measures the NMR signal, it is necessary to apply a strong static magnetic field (0.2 T or more) to an inside of an observation area thereof, in which a subject is placed, and to maintain the static magnetic field in a high uniformity (for example, a variation of about 10 ppm).

Strength of the NMR signal detected according to the spin state of the hydrogen nucleus is proportional to that of the static magnetic field. Thus, an image in a higher resolution requires an increased strength of the static magnetic field. In particular, to generate a high magnetic field (for example, 1 T or more) in an area for an image pickup, a superconducting electromagnet using a superconducting coil is necessary. The superconducting coil needs to be continuously kept at an ultralow temperature. The superconducting coil is thus housed in a coil vessel which is filled with a cooling medium such as liquid helium. The coil vessel is further housed in a vacuum vessel to prevent heat from conducting to the superconducting coil from outside (see U.S. Pat. No. 6,570,475).

Even with the vacuum heat insulation, however, heat of radiation is inevitably conducted to the superconducting coil. It is also difficult to avoid heat conduction thereto from components for supporting the superconducting electromagnet. Thus, a cryocooler is typically provided which has a cooling capacity surpassing heat quantity to be conducted to the superconducting electromagnet. The cryocooler cools the cooling medium in an ultralow temperature system of the coil vessel. One of such well-known cryocoolers is the Gifford-McMahon cryocooler, which is described in "H. Ogiwara, Introduction to Cryogenic Engineering, Tokyo Denki University, (1999)". The Gifford-McMahon cryocooler is configured such that a displacer is inserted into a cylinder to define an expansion chamber, and a volume of the expansion chamber is changed according to a reciprocating movement of the displacer driven by a motor, to thereby generate an ultralow temperature with an adiabatic expansion. Then a wall of the cylinder surrounding the expansion chamber is used as a cold head, which is inserted into the coil vessel to cool the cooling medium.

In the meantime, if the motor of the cryocooler described above is subjected to a leakage magnetic field from the superconducting electromagnet housed in the coil vessel, the motor could stop, or a torque thereof could decrease, though depending on a strength of the leakage magnetic field. To prevent such problems, Japanese Published Patent Application, Publication No. HEI 6-188466 proposes a magnetic shield structure in which a motor is surrounded by flat plates made of a ferromagnetic material, and a hole is created in a position where the motor is connected to a displacer. Japanese Published Patent Application, Publication No. 2004-349477 proposes another magnetic shield structure in which a motor is partly covered with a ferromagnetic material to divert magnetic field lines which may otherwise permeate the motor.

"R. M. Bozorth, Ferromagnetism, D. van Nostrand, Princeton, N.J., p 849 (1951)" describes a relation between a shape of the ferromagnetic material and an easiness of permeating magnetic field lines therethrough (a demagnetizing field coefficient).

The magnetic shield structure according to Japanese Published Patent Application, Publication No. HEI 6-188466 is more desirable than that according to Japanese Published Patent Application, Publication No. 2004-349477. In the former, the entire motor is substantially covered with the ferromagnetic material, whereas in the latter, a leakage magnetic field may permeate the motor, part of which is not covered with the ferromagnetic material.

However, even the magnetic shield structure described in the former has the following problems:

1. The ferromagnetic material plates for covering the motor naturally needs an opening through which a power transmission shaft such as a motor drive shaft, a link mechanism, or the like passes. A leakage magnetic field may permeate the motor through the opening; and 2. If the motor is almost entirely surrounded by the ferromagnetic material plates, maintenance of the motor is difficult to be performed.

In particular, a cryocooler having a driving mechanism generally has a shorter expected lifetime than the superconducting electromagnet. The cryocooler needs to be replaced by a new one sometime within the usage period. When such a cryocooler is first installed, pipes to connect the cryocooler to a compressor for compressing a cooling medium, a power cable to connect the cryocooler to the motor, and the like are also installed. Therefore, when the cryocooler is replaced by a new one later, a magnetic shield thereof and the motor must be also removed.

On the other hand, it is difficult to remove the magnetic shield, because an electromagnetic force of, for example, as strong as about one ton is applied to the ferromagnetic material covering the motor, while the superconducting electromagnet is in operation. It is preferable in general that the cryocooler is continuously operated without demagnetizing the superconducting electromagnet. In the conventional cryocooler, however, when the magnetic shield is removed, the superconducting electromagnet has to be demagnetized. This increases the time necessary for maintenance operations of the cryocooler.

The present invention provides a magnetic shield structure allowing maintenance of a cryocooler to be performed without demagnetizing a superconducting electromagnet, and protecting a motor for driving the cryocooler from a leakage magnetic flux of the superconducting electromagnet.

The inventors have found the following, based on the technology described in "R. M. Bozorth, Ferromagnetism, D. van Nostrand, Princeton, N.J., p 849 (1951)". The inventors herein assume that a pair of plate-like ferromagnetic materials are provided, both of which extend in a direction of the magnetic field lines of the superconducting electromagnet. If a length of each ferromagnetic material plate in the extending direction (in the direction of the magnetic field lines) is sufficiently longer than a thickness thereof, each ferromagnetic material has a smaller demagnetizing field coefficient, and permeates more magnetic field lines therethrough. That is, when the ferromagnetic material plates are provided in a magnetic field generated in a certain space, the magnetic field lines which are present around the space are also attracted to the ferromagnetic material plates, and are made to permeate therethrough. As a result, the magnetic field around the ferromagnetic materials is reduced.

SUMMARY OF THE INVENTION

The superconducting electromagnet according to the present invention includes a coil vessel for housing a superconducting coil and a cooling medium; a vacuum vessel surrounding the coil vessel; a cryocooler provided outside the vacuum vessel for cooling the cooling medium housed in the coil vessel; a motor for driving the cryocooler; and a magnetic shield for protecting the motor from a leakage magnetic flux of the superconducting electromagnet. The magnetic shield is composed of a pair of ferromagnetic material plates placed opposite each other across the motor.

Since a pair of the ferromagnetic material plates are placed in the extending direction of the magnetic field lines, the pair each have a small demagnetizing field coefficient, and thereby a small magnetic resistance. This allows a leakage magnetic flux around the motor to permeate through a pair of the ferromagnetic material plates. As a result, a density of the leakage magnetic flux around the motor therebetween is drastically lowered, and the motor can be magnetically shielded.

Even if a pair of the ferromagnetic material plates are fixed onto an outer surface of the vacuum vessel, there is still a sufficient space sandwiched between a pair of the ferromagnetic material plates, and maintenance of the cryocooler and the motor can be easily performed without demagnetizing a superconducting electromagnet. In addition, a time of the maintenance can be reduced, because demagnetization of the superconducting electromagnet is not necessary. A leakage magnetic field at the motor can also be reduced, and thereby the cryocooler can provide a higher cooling performance without reducing a torque of the motor, which determines the cooling performance.

The magnetic shield according to the present invention may include a ferromagnetic material plate for closing at least any one of the two openings in a horizontal direction at both ends of a pair of the ferromagnetic material plates. In this case, the ferromagnetic material plate for closing at least any one of the two openings may have an opening thereon according to the necessity. Another ferromagnetic material plate may be provided for closing an upper side of a pair of the ferromagnetic material plates. In both cases described above, the ferromagnetic material plate(s) other than a pair of the ferromagnetic material plates may be made smaller in thickness.

In both cases described above, a vacuum vessel is torusshaped. The cryocooler partly comes up above the vacuum vessel in a vertical direction, and cools a cooling medium with the adiabatic expansion thereof by providing a reciprocating movement of a piston, which is inserted into the vacuum vessel in a substantially vertical direction. The motor is connected to a crank mechanism in which the motor shaft is horizontalized, and the piston is reciprocated. In this case, the magnetic shield may include a pair of the ferromagnetic material plates each extending in the vertical direction, and a ferromagnetic material plate provided between each side edge of a pair of the ferromagnetic material plates. Namely, the magnetic shield includes ferromagnetic material plates surrounding an outer circumference of the piston in the range of an azimuth of 270 degrees, and extending in the vertical direction on an outer surface of the vacuum vessel.

In any one of the cases described above, it is preferable that the magnetic shield moves in a direction parallel to the outer surface of the vacuum vessel. Thereby the magnetic shield moves along the outer surface of the vacuum vessel toward a direction where magnetic attraction is weaker. This allows the cryocooler and the motor to be easily taken out from the magnetic shield, and facilitates their maintenance. Since the magnetic shield can be moved separately from the cryocooler, it is also easy to replace the cryocooler with a new one.

In the superconducting electromagnet according to the present invention, assume a case where the superconducting electromagnet includes a primary coil, and a shield coil having a diameter larger than that of the primary coil and allowing an electrical current in a direction opposite that of the primary coil to pass therethrough. A piston cylinder of the cryocooler can be inserted into a position which is on an outer side of an inner diameter of the primary coil, and on an inner side of an outer diameter of the shield coil.

Other features and advantages of the present invention will become more apparent from the following detailed description of the invention, when taken in conjunction with the accompanying exemplary drawings.

DETAILED DESCRIPTION OF THE PREFERRED EMBODIMENTS

With reference to attached drawings, embodiments of a superconducting electromagnet according to the present invention are described below.

First Embodiment

Figure 2:
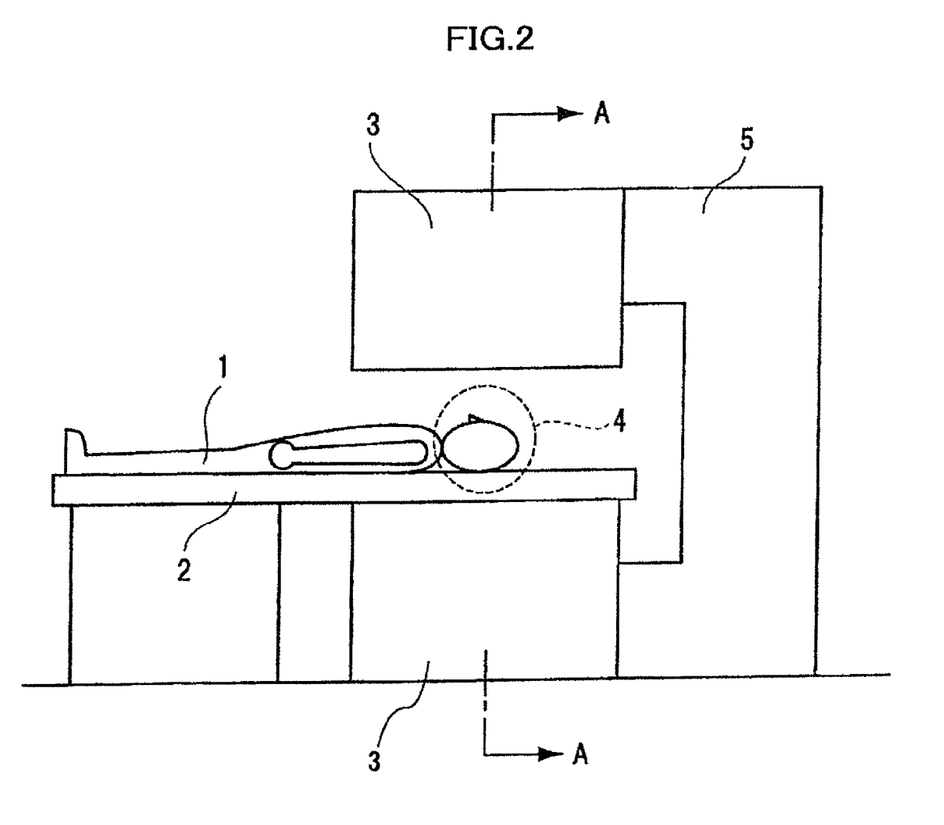
FIG. 2 is a schematic block diagram showing an MRI machine of an embodiment, to which a superconducting electromagnet according to the present invention is applied.
Figure 3:
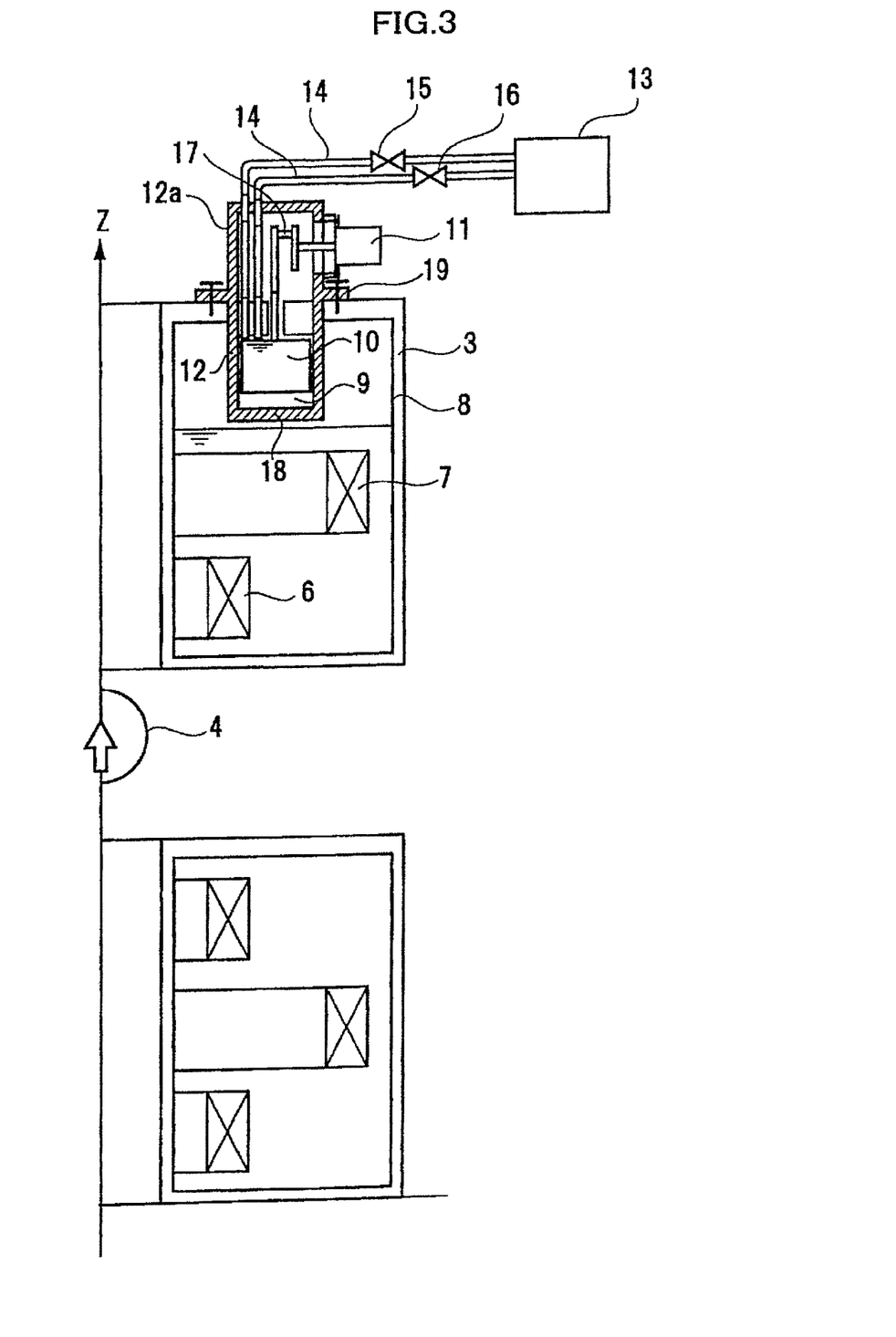
FIG. 3 is a cross sectional block diagram showing a main part of a cooling system of an embodiment, which is applied to the superconducting electromagnet according to the present invention.

As shown in FIG. 2, a human subject 1 lies on a bed 2, and is traveled to a space sandwiched between a pair of vacuum vessels 3, which are opposing to each other above and below across the bed 2. Subsequently, a predetermined observation area 4 and an area for imaging tomographic planes of the human subject 1 are aligned so that the former includes the latter. A pair of the vacuum vessels 3 are connected by a support pillar 5. FIG. 3 is a cross sectional block diagram showing the main part of a cooling system of the MRI machine when cut along the line A-A in FIG. 2, and the bed 2 is not shown herein. Each vacuum vessel 3 houses a static magnetic field generating source, which generates a static magnetic field whose magnetic field is indicated with a direction of an arrow shown in FIG. 3, in the observation area 4. Each vacuum vessel 3 houses a primary coil 6; a superconducting shield coil 7 which flows therein an electrical current in a direction opposite that flowing in the primary coil, for reducing a leakage magnetic field; and a coil vessel 8 filled with a cooling medium such as liquid helium. These components housed in each of the vacuum vessel 3 are provided substantially symmetrical with respect to the axis Z. Each vacuum vessel 3 is typically made of stainless steel. Though not shown, a gradient magnetic field coil for applying a gradient magnetic field for rendering information concerning a spatial position of the human subject 1 to an NMR signal; and a high frequency irradiation coil for applying an electromagnetic wave at the resonant frequency for causing an NMR phenomenon are provided in each vacuum vessel 3 on a side of the bed 2.

The MRI machine having a configuration as described above picks up the NMR signal and creates an image of a desired tomographic plane of the human subject 1. More specifically, the gradient magnetic field generated by the gradient magnetic field coil is superimposed over a uniform static magnetic field generated in the observation area 4 using the static magnetic field generating source. Thus the magnetic field of a predetermined field strength is produced only in a desired tomographic area. Subsequently, an electromagnetic wave at the resonant frequency is irradiated on the desired tomographic area to cause the NMR phenomenon only on the desired tomographic area. The NMR phenomenon produces NMR signals according to the spin state of a hydrogen nucleus. The NMR signals are detected and collected to constitute the image of the desired tomographic area.

Strength of the electromagnetic wave detected according to the hydrogen nucleus spin is generally proportional to that of the static magnetic field. An image of a higher resolution thus requires stronger strength of the static magnetic field. To generate a high magnetic field (for example, 1 T or more) in the observation area, a superconducting electromagnet is used. The superconducting coil needs to be constantly kept at an ultralow temperature. Even with the vacuum heat insulation, however, heat of radiation is inevitably transferred to the superconducting coil. It is also difficult to avoid heat conduction thereto from components for supporting the superconducting electromagnet. Thus, a cryocooler is typically provided, which has a cooling capacity surpassing heat quantity to be conducted to the superconducting electromagnet, to thereby keep the ultralow temperature for a long period of time.

In this embodiment, a Gifford-McMahon cryocooler is used, which is described in detail in the previously cited "H. Ogiwara, Introduction to Cryogenic Engineering, Tokyo Denki University, (1999)". As shown in FIG. 3, the Gifford-McMahon cryocooler is configured such that a displacer 10 as a piston is fitted into a tubular cylinder 12 so that the displacer 10 can slide in its axial direction in the tubular cylinder 12, and that an expansion chamber 9 is formed between a bottom of the displacer 10 and a bottom wall of the cylinder 12. The volume of the expansion chamber 9 is changed according to a reciprocating movement of the displacer 10 in the axial direction thereof, to thereby generate an ultralow temperature with the adiabatic expansion. The displacer 10 is made of a porous cold storage material, and operates also as a cold storage unit for storing cold of a cooling medium which circulates therein.

Figure 4:
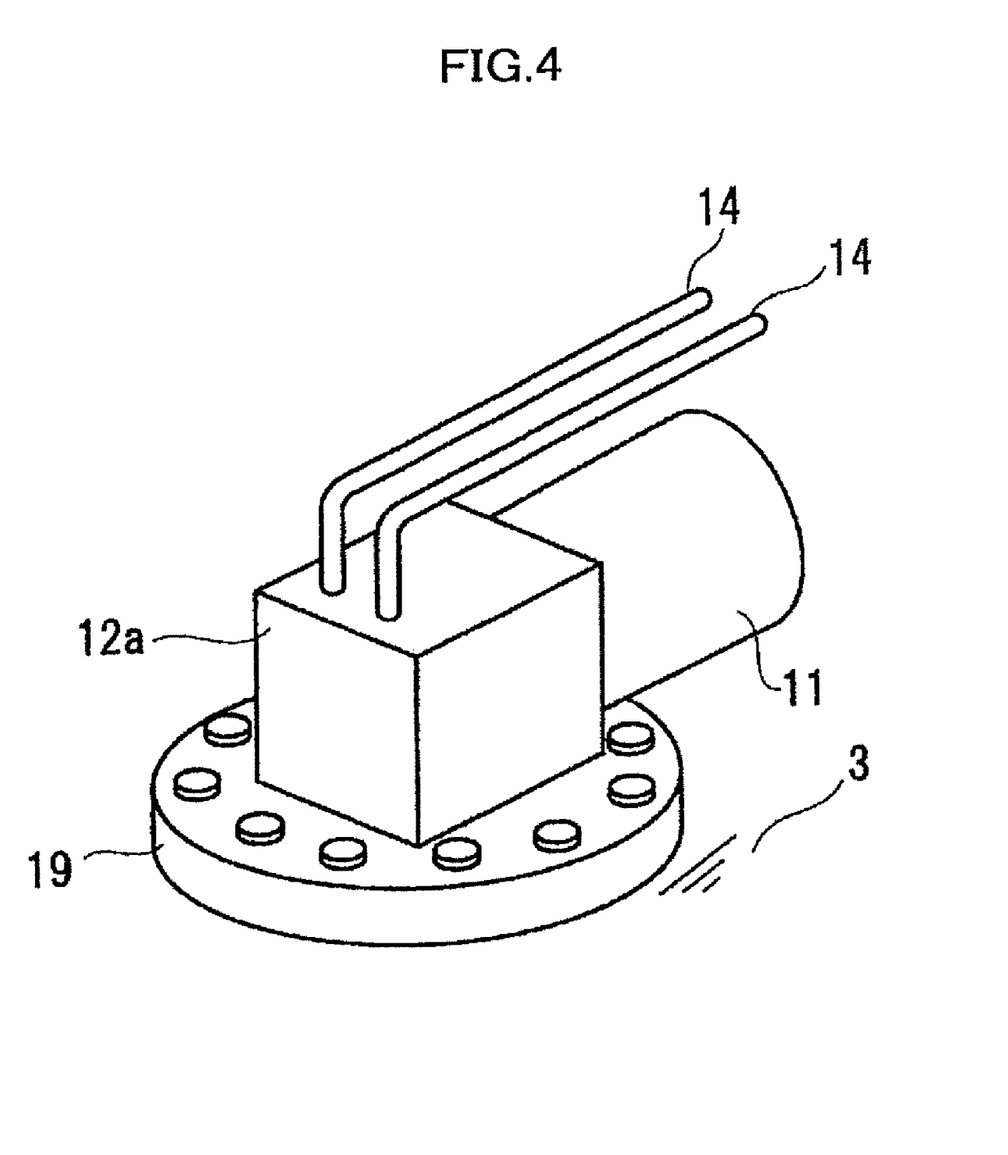
FIG. 4 is a birds eye view showing a top portion of the cryocooler, which comes up outside of the vacuum vessel.
Figure 5:
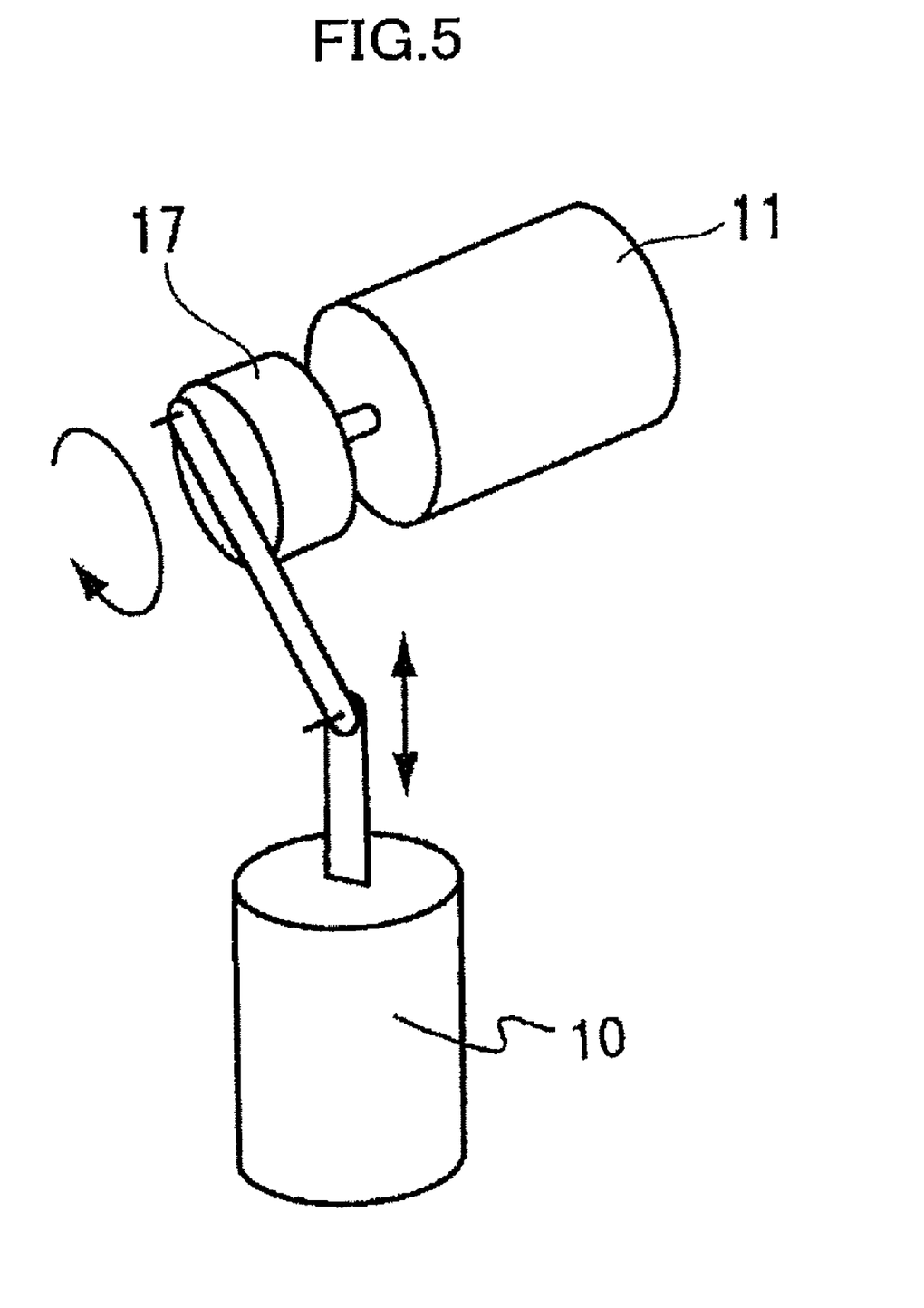
FIG. 5 is an explanatory view illustrating a configuration of a crank mechanism for connecting a displacer and a motor.

As shown in FIG. 4, a Brick-shaped cylinder head 12a is airtightly attached via a flange 19 on top of the cylinder 12 not shown herein. A motor 11 is attached onto a face of the cylinder head 12a, and a rotating shaft of the motor 11 is inserted into the cylinder head 12a. As shown in FIG. 5, the rotating shaft of the motor 11 is connected to the displacer 10 via a crank mechanism, which converts a rotating movement of the motor 11 into a reciprocating movement of the displacer 10. The crank mechanism used herein may be, for example, a Scotch-yoke mechanism. The cooling system shown in FIG. 3 also includes a compressor 13 for feeding a compressed gas into the cylinder 12; a pipe 14 for connecting the compressor 13 and the cylinder 12; and an exhaust valve 15 and an intake valve 16 each provided in the pipe 14, and each operating in synchronization with the motor 11.

Operations of the cryocooler having the above-mentioned configuration are described in detail in the previously cited "H. Ogiwara, Introduction to Cryogenic Engineering, Tokyo Denki University, (1999)". With reference to FIG. 3, the operations from when the displacer 10 is at a lower dead point, until when an ultralow temperature is generated are described below. First, when the displacer 10 is at the lower dead point, that is, when a volume of the expansion chamber 9 is the smallest, the exhaust valve 15 is closed, the intake valve 16 is opened, and a high pressure cooling medium gas compressed in the compressor 13 is flown into the cylinder 12. While the displacer 10 is moving toward an upper dead point, the high pressure cooling medium gas is flown into the expansion chamber 9 through the displacer 10, which also operates as the cold storage unit. During this step, the high pressure cooling medium gas exchanges heat with the cold storage material filled in the displacer 10, and is cooled to an ultralow temperature. After that, when the intake valve 16 is closed and the exhaust valve 15 is opened, the high pressure cooling medium gas in the expansion chamber 9 is flown through the displacer 10 to the compressor 13. During this step, the high pressure cooling medium gas is adiabatically expanded to generate an ultralow temperature in the expansion chamber 9. The bottom of the cylinder 12, which defines the expansion chamber 9, is used as a cold head 18, and can condense into a liquid, the cooling medium gas such as a liquid helium gas, which may have been evaporated due to an undesirable heat entrance.

In order to change the volume of the expansion chamber 9, it is necessary for a torque of the motor 11 to be sufficiently large. To transmit the motor torque effectively, it is necessary for the motor 11 to be placed near the expansion chamber 9. Also to increase heat efficiency, it is necessary for the motor 11 to be placed near the expansion chamber 9. Near the cold head 18, however, a liquid surface of a cooling medium such as liquid helium is provided. And, near the liquid surface of a cooling medium, the superconducting primary coil 6 and the superconducting shield coil 7 are also provided. This means that a leakage magnetic field from the superconducting coils 6, 7 makes a magnetic field at the motor 11 stronger, which could stop the motor 11, or, could decrease the motor torque.

Figure 6:
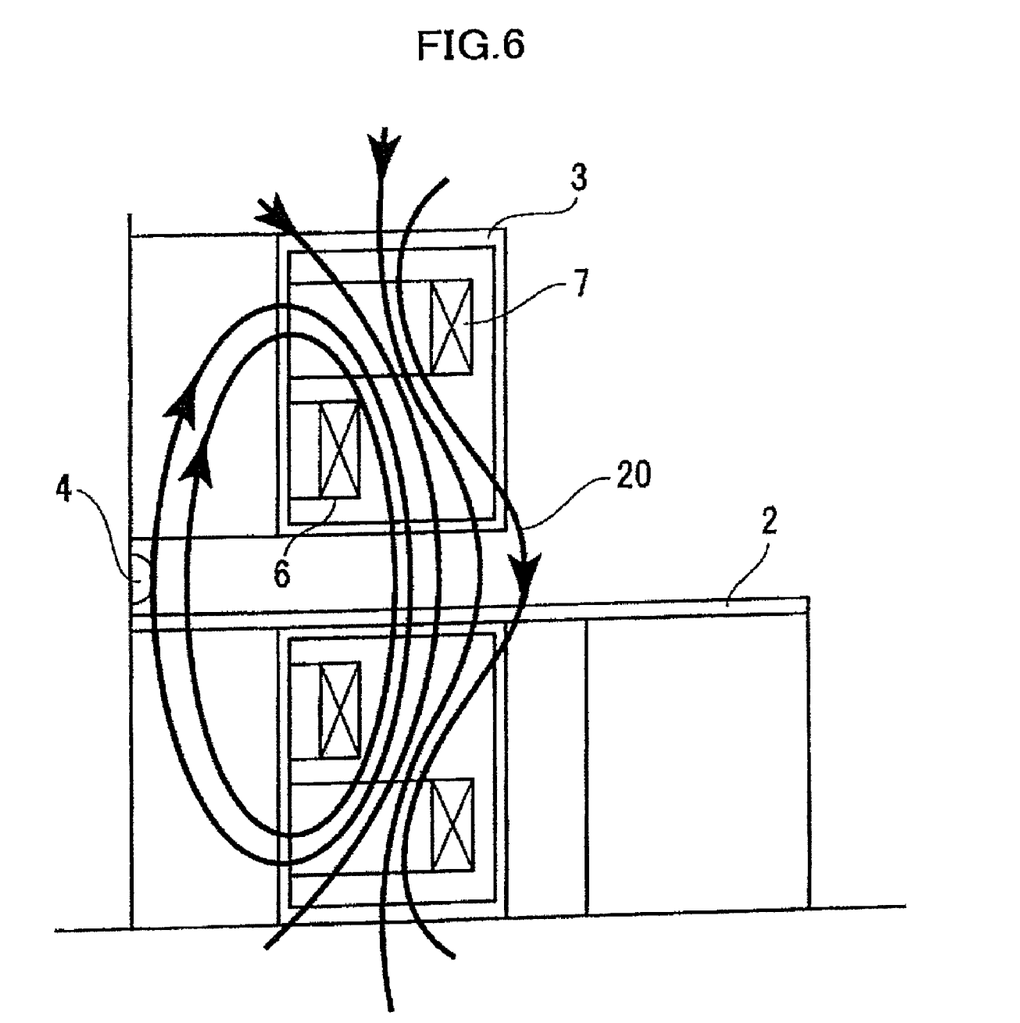
FIG. 6 is an explanatory view illustrating a state of a magnetic field generated by a superconducting coil.

There are, for example, driving mechanism components for transmitting a driving force of the motor 11 to the displacer 10; a pipe through which a compressed cooling medium gas from a compressor passes; and the like, in a space between the motor 11 and the cold head 18. For accommodating those components, a magnetic shield surrounding the motor 11 requires a relatively large opening, from which a leakage magnetic field may permeate the motor 11. It is to be particularly noted that the cylinder 12 of the cryocooler is often provided at a radial position on an outer side of an inner diameter of the superconducting primary coil 6, and on an inner side of an outer diameter of the superconducting shield coil 7. In this case, as shown in FIG. 6, magnetic field flux lines at the motor 11 run substantially parallel to the shaft direction of the cylinder 12 as shown in FIG. 6. Though the cryocooler housed in the vacuum vessel 3 is not shown in FIG. 6, the superconducting primary coil 6 generates an electric current flowing in a direction that produces an upward magnetic field in the observation area 4. Meanwhile, the superconducting shield coil 7 generates an electric current flowing in the opposite direction to that passing through the superconducting primary coil 6. For example, one of the magnetic field flux lines generated as described above is a magnetic field flux line 20 flowing in a direction indicated by the arrow shown in FIG. 6. If the magnetic field line 20 permeates the motor 11, the problems described above may occur. Nevertheless, if the motor 11 is almost completely shielded, maintenance of the same is difficult to be performed.

Figure 1:
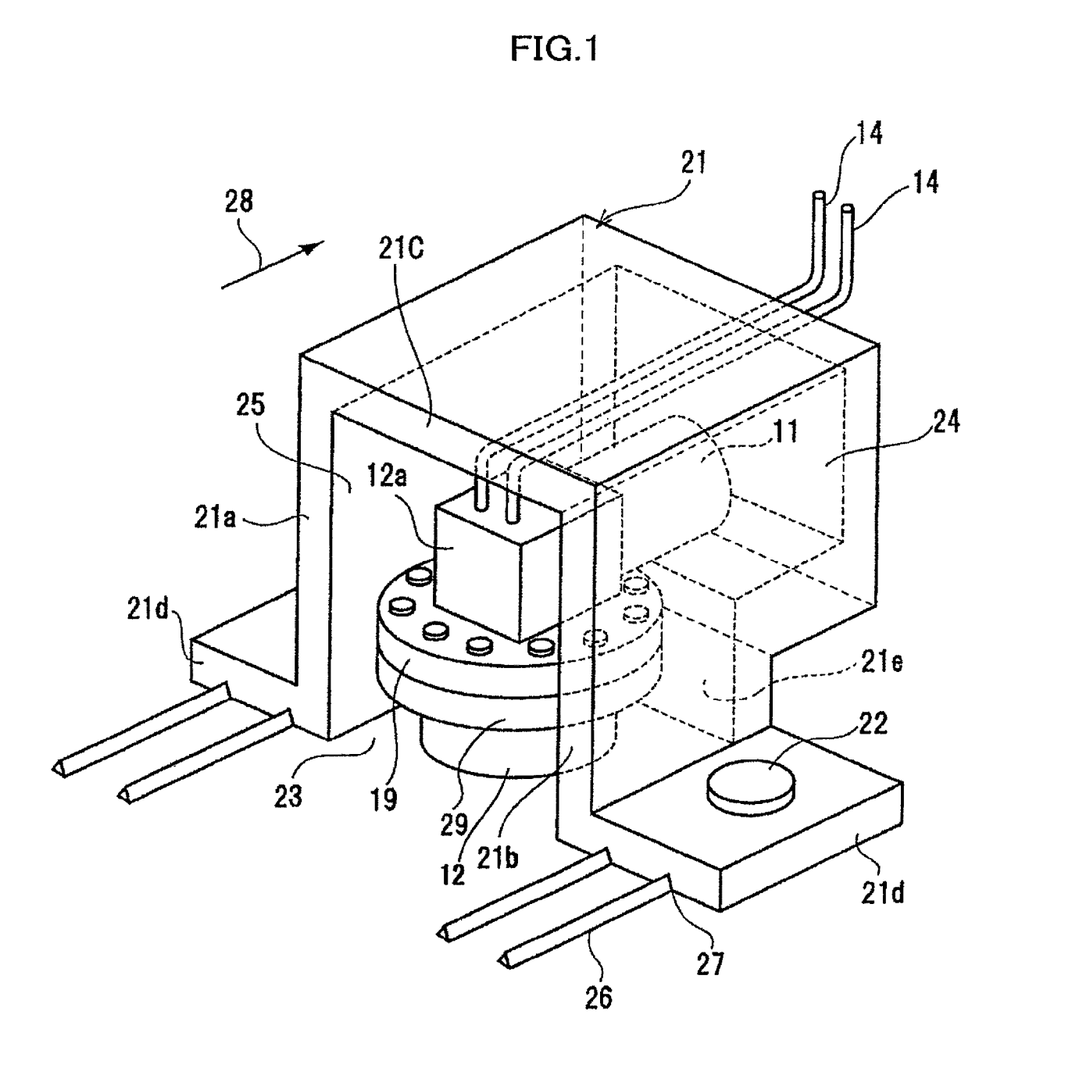
FIG. 1 is a perspective view showing a magnetic shield structure according to a first embodiment of the present invention.

To solve the problems described above, a magnetic shield structure according to an embodiment, of a motor for driving a cryocooler is described with reference to FIG. 1. FIG. 1 is a perspective view of the cryocooler when viewed from above the upper-positioned vacuum vessel 3 shown in FIG. 4. A magnetic shield 21 is fixed with bolts 22, around the motor 11 on an outer surface of the torus-shaped vacuum vessel 3. The magnetic shield 21 includes a pair of same-sized ferromagnetic material plates 21a,21b, which sandwich the motor 11 in a direction parallel to a shaft of the motor 11. Each of the ferromagnetic material plates 21a,21b extends in a direction in which the leakage magnetic flux shown in FIG. 6 mainly runs. A ferromagnetic material plate 21c is also provided between respective side edges of the ferromagnetic material plates 21a,21b, in a horizontal direction on a side nearer the motor 11. An opening space 23 is formed in the vertical direction, in a space sandwiched between the ferromagnetic material plates 21a,21b, on an outer side of the vacuum vessel 3. A portion of the cylinder 12 comes up into the opening 23. A pair of support plates 21d are provided at the lower end of respective ferromagnetic material plates 21a,21b. These ferromagnetic material plates are extending along the shaft direction of the cylinder 12 as shown in FIG. 6. A pair of the support plates 21d are each mounted on the outer surface of the vacuum vessel 3. Each support plates 21d is shorter than a maximum length of each of the ferromagnetic material plates 21a,21b in the motor shaft direction. This makes each of the ferromagnetic material plates 21a,21b partially cut out below an undersurface of the motor 11 in the motor shaft direction. Since each of the ferromagnetic material plates 21a,21b is partially cut out, a ferromagnetic material plate 21e having an L-shaped cross section is provided between respective side edges of the ferromagnetic material plates 21a,21b in the horizontal direction on the side nearer the motor 11. In addition to the opening space 23, the other opening spaces 24, 25 are formed each in a horizontal direction parallel to a pair of the ferromagnetic material plates 21a,21b, on the outer side of the vacuum vessel 3. The opening space 24 is on the side nearer the motor 11, and the opening space 25 is on the opposite side. The opening space 24 is provided above the undersurface of the motor 11.

The magnetic shield 21 according to the embodiment having the configuration described above can provide the following advantages for magnetically shielding the motor 11 in an effective manner. In the magnetic shield 21, each of the ferromagnetic material plates 21a,21b is sufficiently longer than a thickness thereof in a direction of a reciprocating movement of the displacer 10. This enables a demagnetizing field coefficient thereof to be small, and more magnetic field lines to permeate therethrough. Magnetic field lines parallel thereto permeate therethrough, and a leakage magnetic field at the motor 11 can be weakened.

Magnetic field lines parallel to the motor shaft direction also permeate through the opening space 24 and the ferromagnetic material plates 21a,21b, and a leakage magnetic field at the motor 11 can also be weakened. Additionally, the opening space 24 facilitates installation of the pipe 14 connected to the compressor 13, a power cable not shown for driving the motor 10, and the like.

It is preferable that a plurality of rails 26 are placed on the outer surface of the upper-positioned vacuum vessel 3; grooves 27 for the rails 26 are provided on an undersurface of each support plate 21d of the magnetic shield 21; and the magnetic shield 21 moves in a direction of an arrow 28 shown in FIG. 1. With this configuration, when the bolts 22 are unscrewed to move the magnetic shield 21 along the rails 26, the cryocooler and the motor 11 can be completely taken out from the magnetic shield 21, which facilitates maintenance of the cryocooler. Electromagnetic force acting on the magnetic shield 21 is proportional to a spatial gradient of a magnetic field strength. Herein an electromagnetic force in a direction in which the magnetic shield 21 moves on a face of the vacuum vessel 3 is smaller than that in a direction in which the magnetic shield 21 moves away from the superconducting primary coil 6 and the superconducting shield coil 7, that is, away from the vacuum vessel 3. If the cryocooler is replaced with a new one while a magnetic field is generated, it is easier to move the magnetic shield 21 on the rails 26 and taken out the cryocooler, rather than to take out the cryocooler together with the magnetic shield 21, because of a smaller electromagnetic force. Moreover, since it is not necessary to demagnetize the superconducting electromagnet, the time necessary for maintenance of the cryocooler is reduced.

Magnetic field lines permeating the motor 11 from the opening space 23 can be further prevented by extending a flange 29 on a vacuum vessel side, coupled to the flange 19 on a cryocooler side, in the vertical direction, and by enlarging the opening space 23 in the vertical direction.

Figure 7:
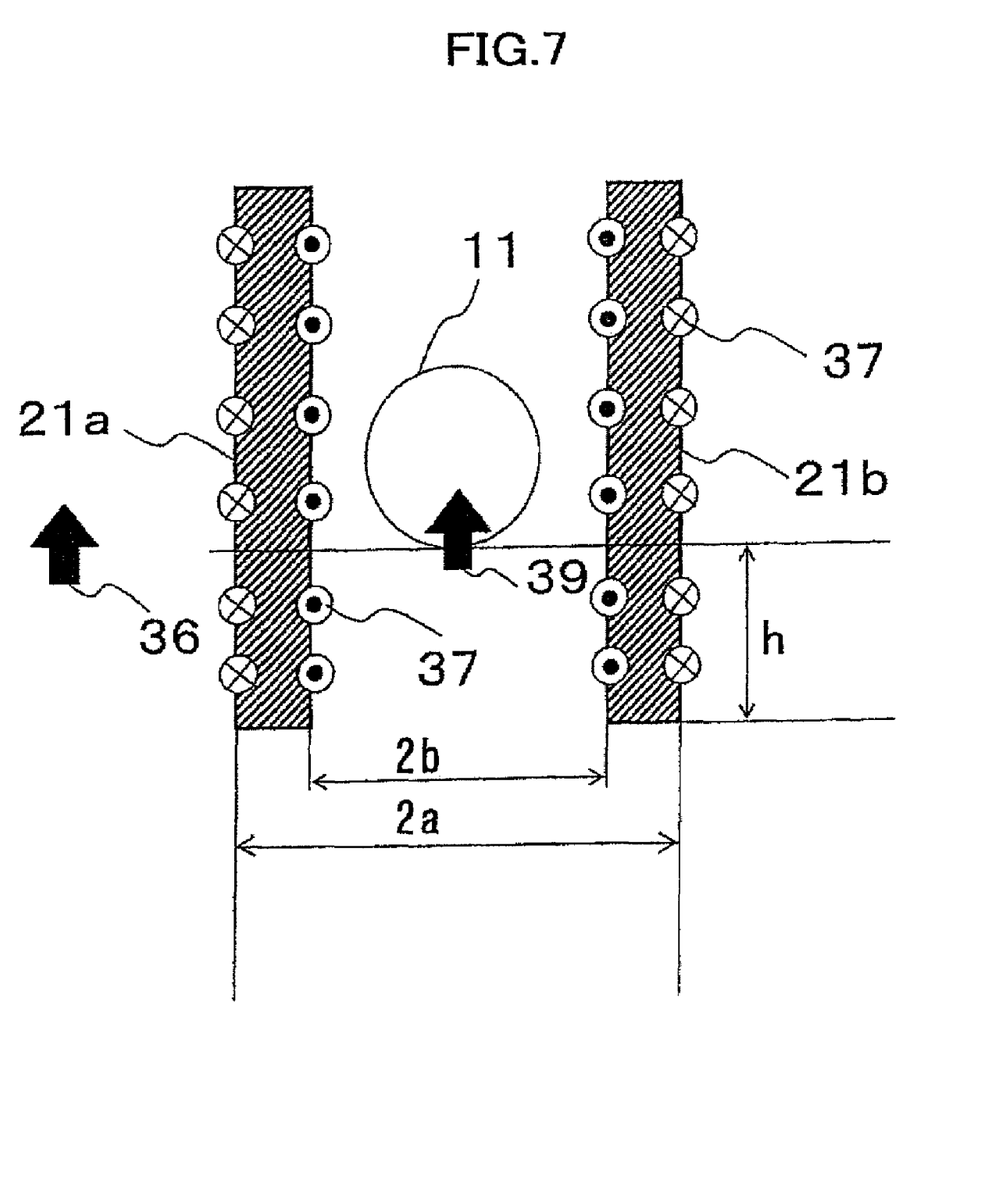
FIG. 7 is an explanatory view illustrating a shielding effectiveness by a pair of ferromagnetic material plates.

Next is described a length of the reciprocating movement made by the displacer 10 for the ferromagnetic material plates 21a,21b. FIG. 7 is an explanatory view illustrating the ferromagnetic material plates 21a,21b when viewed along a direction of the rotating shaft of the motor 11. A space below the motor 11 is a portion of the opening space 23 as shown in FIG. 1. Assume that a direction of a leakage magnetic field 36 is upward parallel to the ferromagnetic material plates 21a,21b as shown in FIG. 7, without the ferromagnetic material plates 21a,21b and the motor 11. A surface magnetization current 37 is regarded as flowing on each surface of the ferromagnetic material plates 21a,21b in a vertical direction with respect to the plane of FIG. 7. The surface magnetization current 37 flows on an outer surface of the ferromagnetic material plates 21a,21b in a direction from the backside to the front side with respect to the same, or on an inner surface thereof in a direction from the front side to the back side with respect to the same. A magnetic field generated by the surface magnetization current 37 makes a magnetic flux density 39 on the undersurface of the motor 11 smaller than that of the leakage magnetic field 36, so that the motor 11 is magnetically shielded.

Calculate next the magnetic flux density 39 on the undersurface of the motor 11. $2b$ represents a distance between each inner surface of the ferromagnetic material plates 21a, 21b, and $2a$ represents a distance between each outer surface thereof. h represents a distance between the undersurface of the motor 11 and a lower end of any one of the ferromagnetic material plates 21a,21b. The magnetic flux density 39 on the undersurface of the motor 11 can be expressed by formula 1:

$$B = B_{ext} + \frac{2\mu_0}{2p} \frac{B_s}{\mu_0} \int_0^h \left( \frac{a}{a^2+z^2} - \frac{b}{b^2+z^2} \right) dz \quad \text{Formula 1}$$

wherein, $B_{ext}$ (T) represents the leakage magnetic field 36; $\mu 0$ (H/m) represents a vacuum magnetic permeability; and $B_s$ (T) represents a saturation magnetization.

Formula 1 assumes that the surface magnetization current 37 has an infinite length in the vertical direction with respect to the plane of FIG. 7, and has a strength corresponding to the saturation magnetization Bs (T). Further, to evaluate effects made by a portion lower than the undersurface of the motor 11, of the ferromagnetic material plates 21a,21b, only a magnetic field generated by the surface magnetization current 37 within the distance h is taken into account.

An integration expressed by formula 1 is performed to obtain formula 2. A relation between the inner distance $2b$, and the outer distance $2a$ is expressed by formula 3. Formula 3 assumes that all magnetic field flux lines permeating through between the outer distance $2a$ permeate through the ferromagnetic material plates 21a,21b:

$$B = B_{ext} + \frac{B_s}{p}\left(\tan^{-1}\frac{h}{a} - \tan^{-1}\frac{h}{b}\right) \quad \text{Formula 2}$$

$$b = \frac{B_s - B_{ext}}{B_s} a \quad \text{Formula 3}$$

Figure 8:
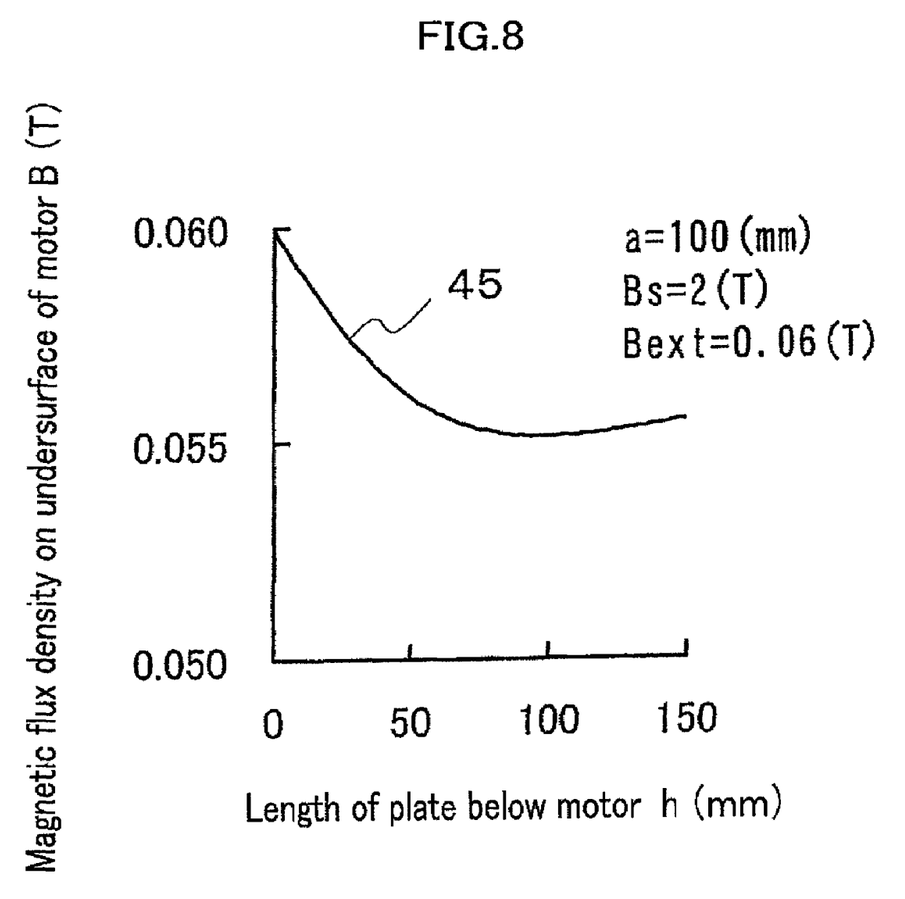
FIG. 8 is a diagrammatic view showing a magnetic field distribution in an opening space formed by a pair of the ferromagnetic material plates of FIG. 7.

A relation between the distance h and the magnetic flux density 39 obtained by formula 2 and formula 3 is shown in FIG. 8. Values used for calculating the relation are also shown in FIG. 8. Its vertical axis represents the magnetic flux density 39 on the undersurface of the motor 11, and its horizontal axis represents the distance h between the undersurface of the motor 11 and the lower end of any one of the ferromagnetic material plates 21a,21b. A curved line 45 represents the relation between the distance h and the magnetic flux density 39.

As seen in FIG. 8, when the distance h is equal to a half, "a", of the outer distance $2a$, the magnetic flux density 39 takes the minimum value. Moreover, if the distance h is in a range between about ¼ and about ½ of the outer distance $2a$, an effect of reducing the magnetic flux density 39 is as much as about 80% of that at the minimum value. Therefore, it proves that the magnetic flux density 39 can be sufficiently reduced, when the distance h is in a range between about ¼ and about ½ of the outer distance $2a$.

Second Embodiment

Figure 9:
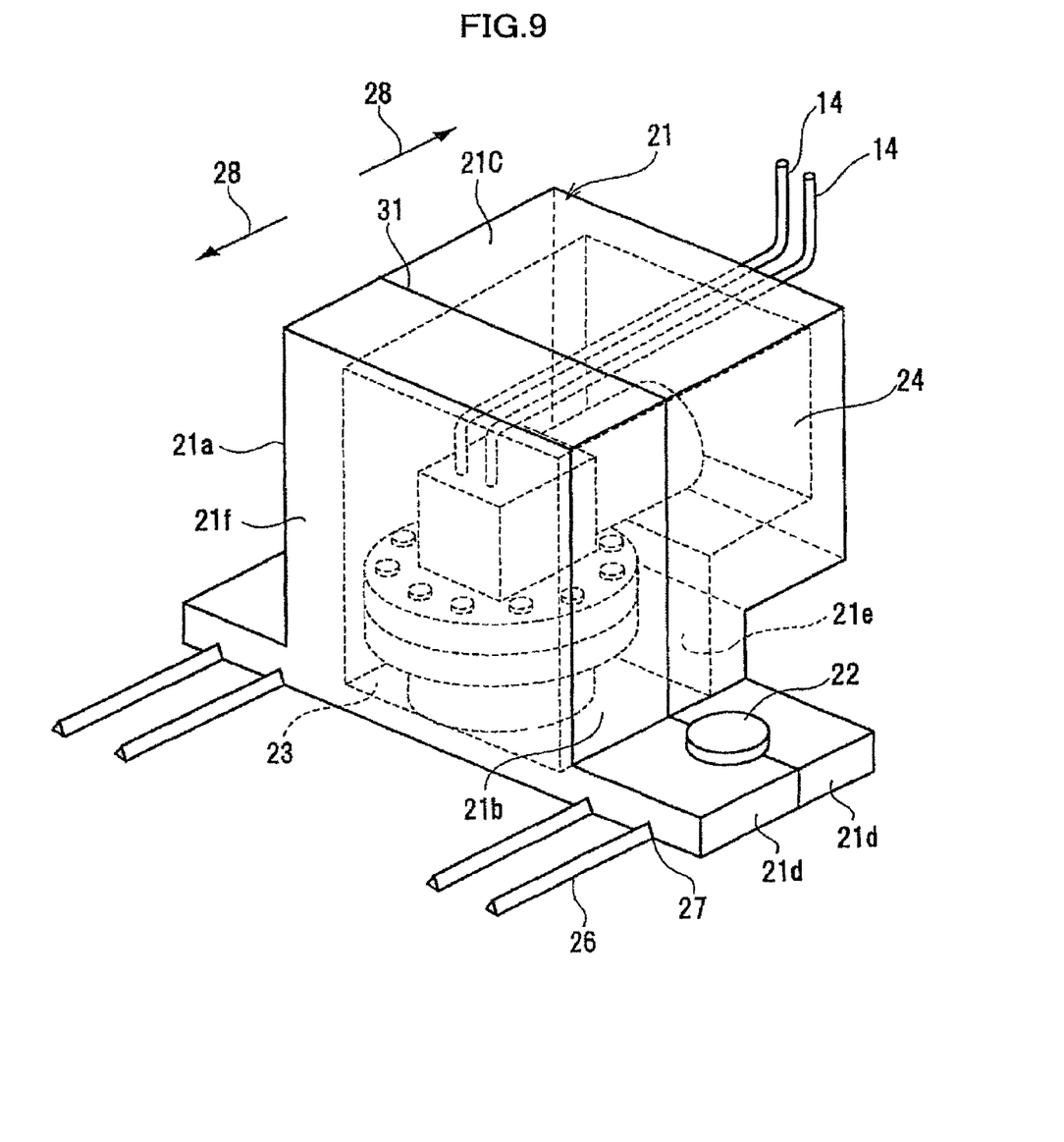
FIG. 9 is a perspective view showing a magnetic shield structure according to a second embodiment of the present invention.

FIG. 9 is a perspective view showing a magnetic shield structure according to a second embodiment of the present invention. The second embodiment has the same configuration as that of the first embodiment shown in FIG. 1, except that an opening space 25 of a magnetic shield 21 is shielded by a ferromagnetic material plate 21f, and that the magnetic shield 21 can be divided into two, taking a surface 31 connecting a pair of bolts 22 as a separation plane. Other than that, the same reference numerals are assigned to the same components as those in the first embodiment, and description thereof is omitted herefrom.

Similarly to the first embodiment shown in FIG. 1, the magnetic shield 21 in this embodiment has an opening space 23 surrounded by ferromagnetic material plates 21a,21b and ferromagnetic material plates 21e,21f, and extending in a reciprocating movement direction of a displacer 10. The opening space 23 is sufficiently longer in the reciprocating movement direction than a thickness of each of the plates 21a,21b,21e,21f, so that each demagnetizing field coefficient thereof is small, which allows the plates to permeate more magnetic field lines. This can sufficiently reduce a leakage magnetic field at the motor 11.

The magnetic shield 21 also has an opening space 24 like in the first embodiment, which facilitates installation of a pipe 14 connected to a compressor, a power cable for driving the motor 11, and the like.

In this embodiment, the magnetic shield 21 can be divided into two, taking the surface 31 as a separation plane. When a pair of the bolts 22 are unscrewed, the magnetic shield 21 is divided into two to move along rails 26. This allows both the cryocooler and the motor to be entirely taken out from the magnetic shield 21, which makes their maintenance operations easier.

Third Embodiment

Figure 10:
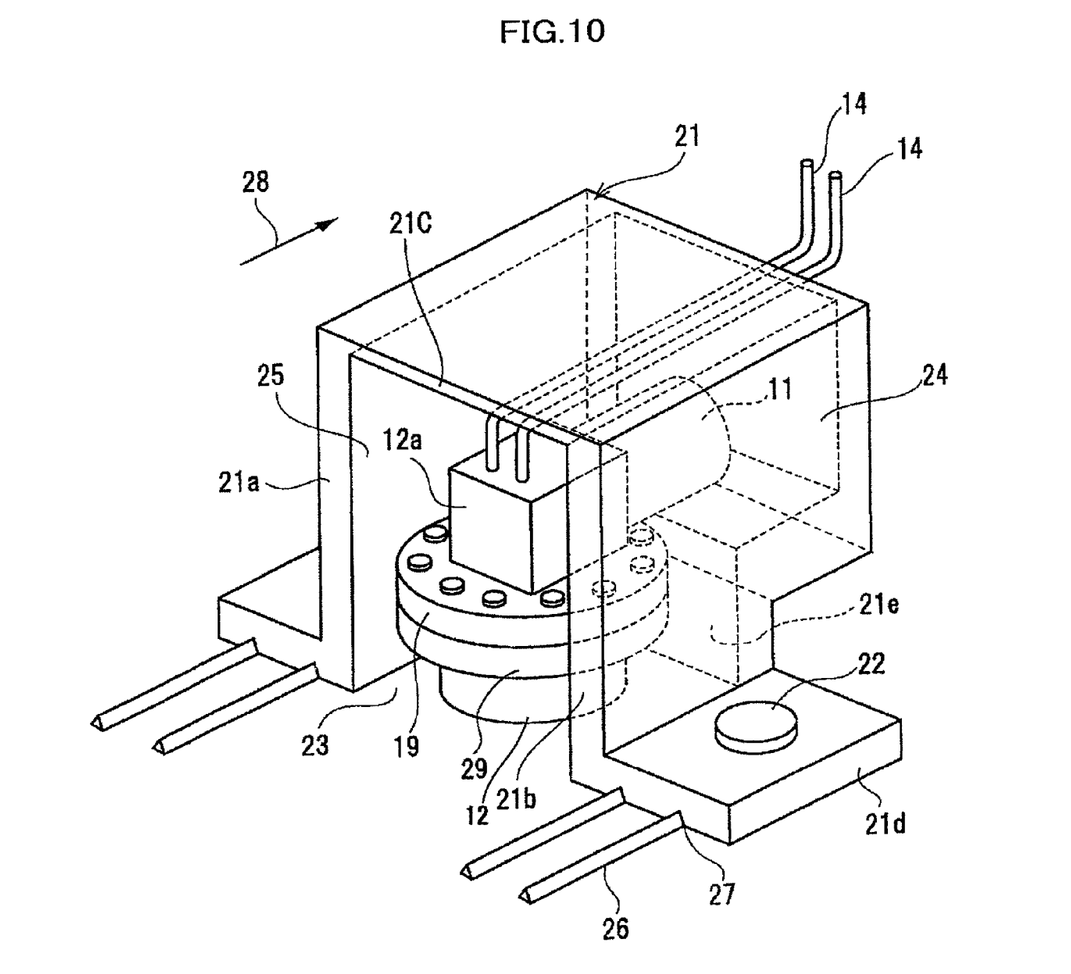
FIG. 10 is a perspective view showing a magnetic shield structure according to a third embodiment of the present invention.

FIG. 10 is a perspective view showing a magnetic shield structure according to a third embodiment of the present invention. The third embodiment has the same configuration as that of the first embodiment shown in FIG. 1, except that a thickness of a ferromagnetic material plate 21c is smaller than that of each of the ferromagnetic material plates 21a,21b. The ferromagnetic material plate 21c is placed between respective upper ends of the ferromagnetic material plates 21a,21b to cover an upper side of an opening space 23. Other than that, the same reference numerals are assigned to the same components as those in the first embodiment, and description thereof is omitted herefrom.

Even with the configuration described above, since magnetic field lines at the ferromagnetic material plate 21c direct vertically upward, each of two wider faces of the ferromagnetic material plate 21c is substantially vertical to the magnetic field lines. Thus, as described in "R. M. Bozorth, Ferromagnetism, D. van Nostrand, Princeton, N.J., p 849 (1951)", a demagnetizing field coefficient of the ferromagnetic material plate 21c becomes larger, and an effect of a magnetic material in the ferromagnetic material plate 21c is reduced. Consequently, even if the thickness thereof is made smaller, a leakage magnetic field at the motor 11 can be sufficiently reduced as in the first embodiment.

The ferromagnetic material plate 21c smaller in thickness in this embodiment can be applied to the second embodiment. Even if the thickness of the ferromagnetic material plate 21c is made smaller, the demagnetizing field coefficient thereof is sufficiently large. Hence, magnetic field lines easily permeate therethrough, which enables this embodiment to provide the effect similar to that of the first embodiment.

Fourth Embodiment

Figure 11:
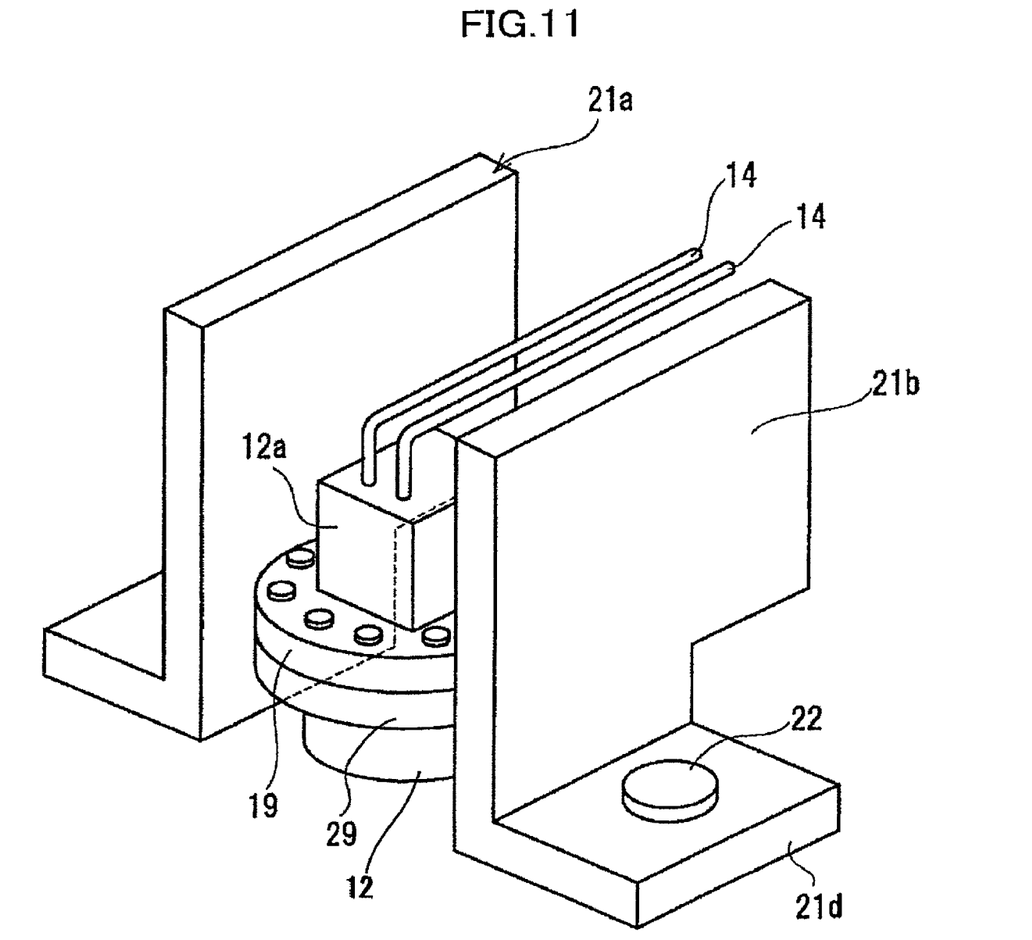
FIG. 11 is a perspective view showing a magnetic shield structure according to a fourth embodiment of the present invention.

FIG. 11 is a perspective view showing a magnetic shield structure according to a fourth embodiment of the present invention. The fourth embodiment has the same configuration as that of the first embodiment shown in FIG. 1, except that a magnetic shield 21 is composed of only ferromagnetic material plates 21a,21b. Other than that, the same reference numerals are assigned to the same components as those in the first embodiment, and description thereof is omitted herefrom.

Pursuing a further smaller thickness of the ferromagnetic material plate 21c in the third embodiment, a ferromagnetic material plate 21c and a ferromagnetic material plate 21e are completely eliminated in this embodiment. Magnetic field lines at a pair of ferromagnetic material plates 21a,21b are parallel to each of wider faces thereof, so that each demagnetizing field coefficient thereof can be made smaller. Hence, magnetic field lines at the motor 11 can be sufficiently attracted thereto, which enables this embodiment to provide the same effect as those in the first to third embodiments.

The embodiments according to the present invention have been explained as aforementioned. However, the embodiments of the present invention are not limited to those explanations, and those skilled in the art ascertain the essential characteristics of the present invention and can make the various modifications and variations to the present invention to adapt it to various usages and conditions without departing from the spirit and scope of the claims.

The invention claimed is:

1. A superconducting electromagnet, comprising:
   a coil vessel for housing a superconducting coil and a cooling medium;
   a vacuum vessel surrounding the coil vessel;
   a cryocooler provided outside the vacuum vessel for cooling the cooling medium housed in the coil vessel;
   a motor for driving the cryocooler; and
   a magnetic shield for protecting the motor from a magnetic flux of the superconducting coil, wherein the magnetic shield includes a pair of ferromagnetic material plates placed opposite each other across the motor,
   wherein each of the pair of ferromagnetic material plates has an upper side extending in a direction parallel to a shaft of the motor and being furthest from the vacuum vessel and a lower side extending in the direction parallel to the rotating shaft of the motor and being closest to the vacuum vessel, and
   wherein a length of the upper side extending in the direction parallel to the shaft of the motor of each of the pair of ferromagnetic plates is longer than a length of the lower side extending in the direction parallel to the shaft of the motor of each of the pair of ferromagnetic plates.

2. The superconducting electromagnet according to claim 1,
   wherein the vacuum vessel is torus-shaped,
   wherein the cryocooler is provided on an upper portion of the vacuum vessel in a vertical direction, and cools the cooling medium with an adiabatic expansion by providing a reciprocating movement of a piston, which is inserted into the vacuum vessel in a substantially vertical direction;
   wherein a shaft of the motor is horizontal, and the motor is connected to a crank mechanism, which converts a rotating movement of the motor into a reciprocating movement of the piston; and
   wherein the pair of ferromagnetic material plates extends in the substantially vertical direction.

3. The superconducting electromagnet according to claim 2,
   wherein the magnetic shield includes a third ferromagnetic material plate provided between respective side edges of the pair of the ferromagnetic material plates.

4. The superconducting electromagnet according to claim 3,
   wherein the third ferromagnetic material plate is made smaller in thickness.

5. A superconducting electromagnet, comprising:
   a coil vessel for housing a superconducting coil and a cooling medium;
   a vacuum vessel surrounding the coil vessel;
   a cryocooler provided outside the vacuum vessel for cooling the cooling medium housed in the coil vessel;
   a motor for driving the cryocooler; and
   a magnetic shield for protecting the motor from a magnetic flux of the superconducting coil,
   wherein the cryocooler is provided on an outer surface of the vacuum vessel, has a piston inserted in a substantially vertical direction into the vacuum vessel, reciprocates the piston by the motor, and cools the cooling medium with an adiabatic expansion, and
   wherein the magnetic shield includes ferromagnetic material plates surrounding an outer circumference of the piston in a range of an azimuth of 270 degrees, and extends in the substantially vertical direction on the outer surface of the vacuum vessel,
   wherein each of the pair of ferromagnetic material plates has an upper side extending in a direction parallel to a shaft of the motor and being furthest from the vacuum vessel and a lower side extending in the direction parallel to the rotating shaft of the motor and being closest to the vacuum vessel, and
   wherein a length of the upper side extending in the direction parallel to the shaft of the motor of each of the pair of ferromagnetic plates is longer than a length of the lower side extending in the direction parallel to the shaft of the motor of each of the pair of ferromagnetic plates.

6. The superconducting electromagnet according to claim 1, wherein the magnetic shield can be moved in a direction parallel to the outer surface of the vacuum vessel.

7. The superconducting electromagnet according to claim 2,
   wherein the superconducting coil includes a primary coil, and a shield coil having a diameter larger than that of the primary coil and allowing an electrical current, in a direction opposite to that of the primary coil, to pass therethrough; and
   wherein the piston is inserted into a position which is on an outer side of an inner diameter of the primary coil, and on an inner side of an outer diameter of the shield coil.

8. The superconducting electromagnet according to claim 1, wherein the pair of ferromagnetic plates are parallel to a main axis of the motor.

9. The superconducting electromagnet according to claim 1, wherein the pair of ferromagnetic plates are parallel to the rotating shaft of the motor.

10. The superconducting electromagnet according to claim 1, wherein the pair of ferromagnetic plates are parallel to a direction of reciprocating movement of a displacer connected to the motor.

11. The superconducting electromagnet according to claim 5, wherein the main axis of the motor is perpendicular to a plane defined by said opening.

12. The superconducting electromagnet according to claim 5, wherein the rotating shaft of the motor lies along an axis that is perpendicular to a plane defined by said opening.

13. The superconducting electromagnet according to claim 1, further comprising an L-shaped ferromagnetic plate connected between the pair of ferromagnetic plates.

14. The superconducting electromagnet according to claim 2, further comprising an L-shaped ferromagnetic plate connected between the pair of ferromagnetic plates.

* * * * *